(12) United States Patent
Rehm

(10) Patent No.: US 6,182,819 B1
(45) Date of Patent: Feb. 6, 2001

(54) ARTICLE CARRIER WITH ADJUSTABLE SUPPORT ELEMENTS AND A REFLOW SOLDERING SYSTEM PROVIDED WITH SUCH AN ARTICLE CARRIER

(75) Inventor: Johannes Rehm, Schelklingen (DE)

(73) Assignee: Rehm Anlagenbau GmbH + Co. (DE)

( * ) Notice: Under 35 U.S.C. 154(b), the term of this patent shall be extended for 0 days.

(21) Appl. No.: 09/259,577

(22) Filed: Mar. 1, 1999

(30) Foreign Application Priority Data

Jun. 15, 1988 (DE) .......................................... 298 10 695 U

(51) Int. Cl.$^7$ .................................................... B65G 17/34
(52) U.S. Cl. .................................. 198/803.11; 198/867.08
(58) Field of Search ........................ 198/803.11, 867.08, 198/803.14, 867.11; 269/90, 166–170

(56) References Cited

U.S. PATENT DOCUMENTS

| | | | |
|---|---|---|---|
| 2,362,067 | * 11/1944 | Heinrich | 269/169 |
| 4,787,505 | * 11/1988 | Tweedy | 198/803.11 |
| 5,094,131 | * 3/1992 | Sorensen et al. | 269/169 |
| 5,346,058 | * 9/1994 | Santandrea et al. | 198/803.11 |
| 5,511,651 | 4/1996 | Barth | 198/117 |
| 5,540,376 | 7/1996 | Asla et al. | 228/37 |

FOREIGN PATENT DOCUMENTS

| | | |
|---|---|---|
| 88 11 968 | 11/1989 | (DE) . |
| 40 10 359 | 10/1991 | (DE) . |
| 92 02 368 | 9/1992 | (DE) . |

* cited by examiner

*Primary Examiner*—Christopher P. Ellis
*Assistant Examiner*—Mark A. Deuble
(74) *Attorney, Agent, or Firm*—Fields and Johnson, P.C.

(57) ABSTRACT

An article carrier is disclosed having adjustable support elements for receiving articles of different sizes, in particular for supporting printed circuit boards of different sizes during transport through a reflow soldering system. The article carrier further comprises a frame, wherein especially one frame member of the frame is used as a support for an article to be carried, and at least one additional supporting element which is adapted to be adjusted relative to the frame member, wherein arresting elements are provided for arresting the support element relative to the frame member. One major aspect of the invention is the fact that the arresting elements are adapted to be releasably arrested on guide rods along which the supporting element is displaceable. Thus the article carrier may automatically be adapted to different sizes of printed circuit boards.

24 Claims, 4 Drawing Sheets

ARTICLE CARRIER WITH ADJUSTABLE SUPPORT ELEMENTS AND A REFLOW SOLDERING SYSTEM PROVIDED WITH SUCH AN ARTICLE CARRIER

The present invention refers to an article carrier with adjustable support elements for receiving thereon articles of different sizes, in particular for supporting printed circuit boards of different sizes during transport through a reflow soldering system, comprising a frame means, especially one frame member of said frame means being used as a support for an article to be carried, and at least one additional supporting element which is adapted to be adjusted relative to the frame member. In addition, the present invention refers to a reflow soldering system used for carrying out a reflow soldering process at printed circuit boards provided with electronic components, said reflow soldering system comprising an article carrier system.

Reflow soldering systems by means of which electronic components premounted on printed circuit boards are soldered and thus electrically connected to a wiring scheme on the printed circuit board under the influence of heat are generally known in the prior art. In such reflow soldering systems, it is necessary to transport the articles, i.e. the printed circuit boards, through a comparatively long system with different zones, viz. A preheating zone, a main heating zone, a cooling zone and a discharge area. The printed circuit boards are moved through these zones on an article carrier by means of a transport mechanism, e.g. a conveying chain or a link belt driven by the system.

Such a reflow soldering system is an acquisition necessitating a very high investment. Hence, it goes without saying that it is necessary that such a system is suitable for more than one specific size of printed circuit boards. For treating printed circuit boards of various sizes in such a reflow soldering system, it has hitherto been common practice to replace the article carrier by an article carrier adapted to the size of the printed circuit boards to be processed at the time in question. This required, on the one hand, the provision of a comparatively large supply of suitable article carriers for the respective sizes of the printed circuit boards to be processed; on the other hand, complicated and time-consuming manipulations by an operator were necessary for exchanging the article carriers upon changing from one size of printed circuit boards to a new one.

Even if stocks of many different article carriers were kept in supply, it was only possible to process standard sizes of printed circuit boards to which the article carriers were adapted. Specially manufactured printed circuit boards could not be transported through such a reflow soldering system. For solving this problem, the individual article carriers had to be modified or adapted by hand by an operator.

However, any intervention on the part of the operator in the operation of a reflow soldering system results in a drastic decrease of the efficiency of the throughput through the system, and, in connection with the high acquisition cost of a reflow soldering system, this results in a significant problem of costs.

It is therefore the object of the present invention to provide an article carrier of the type mentioned at the start by means of which the article carrier can easily be adjusted to different sizes of printed circuit boards, which may perhaps also deviate from a standard size.

It is a further object of the present invention to provide a reflow soldering system of the type mentioned at the start, which makes use of such an article carrier and by means of which an adaptation of the article carrier to the size of a printed circuit board to be processed can be carried out mechanically, i.e. by machine.

According to the present invention, the first object is achieved by an article carrier with adjustable support elements for receiving thereon articles of different sizes, in particular for supporting printed circuit boards of different sizes during transport through a reflow soldering system, comprising a frame means, especially one frame member of said frame means being used as a support for an article to be carried, and at least one additional supporting element which is adapted to be adjusted relative to the frame member, wherein arresting means are provided with the aid of which the supporting element can be arrested relative to the frame member, said arresting means being adapted to be releasably arrested on a guide means along which the supporting element is displaceable.

With the aid of the arresting means, the supporting element can be fixed relative to the frame member reliably and permanently. A time-consuming modification of the article carrier, which has hitherto been necessary according to the prior art and after which the article carrier was incorporated into the transport mechanism of the reflow soldering system, is no longer necessary when the system according to the present invention is used. The article carrier need not be removed from its position in the transport system of the reflow soldering system when the adaptation to the printed board to be transported at the time in question is carried out by releasing the locking engagement, displacing the supporting element and reestablishing the locking engagement. The article carrier according to the present invention has the additional advantage that an adaptation can be carried out mechanically by a reflow soldering system. The downtimes of the machine, which have hitherto been necessary due to the intervention on the part of the operator for adapting the article carrier to the size of the printed board, are thus eliminated. The efficiency and the overall performance of the machine that can be achieved in this way are higher than those that could be achieved according to the prior art.

In accordance with an advantageous further development, the arresting means permit a stepless fine adjustment for adjusting the positions which the supporting element and the frame member, on which the printed circuit boards are supported, occupy relative to one another.

In accordance with another advantageous further development of the present invention, the arresting system comprises clamping means with the aid of which it is possible to carry out a stepless fine adjustment of the position of the supporting element relative to the frame member acting as an additional support.

According to another advantageous further development, the clamping means is realized in that the clamping elements comprise at least one clamping plate, which is articulated on a body and provided with an opening through which a profile of a rail extends at least partially, and respective biasing means with the aid of which the clamping plate(s) articulated on the body is (are) deflected until it (they) abut(s) in the area of the opening on the profile of the rail.

This permits a particularly simple, but mechanically reliable stepless adjustment, which is easy to execute and which results in a fixing of the supporting element that is extremely reliable for the present purposes. In particular, this structural design of the clamping element permits a very simple mechanical adjustment operation, since, for the purpose of delocking, it is only necessary to press the clamping plates onto the body in a direction opposite to the biasing force. This can be realized e.g. by means of a simple gripping element or a fork, which is provided in the reflow soldering system such that it is movable along the clamping plates and displaceable in the direction of adjustment. This solution is very simple from the mechanical point of view and, consequently, it is very advantageous as far as costs are concerned.

In accordance with a further advantageous embodiment, the article carrier is provided with a vertically adjustable centre support. On the one hand, this centre support prevents the printed board from being deformed due to its gravitational force when exposed to the high temperatures which are required for carrying out the reflow process, on the other hand the vertical adjustability permits an exact adaptation to the kind of printed circuit board to be processed.

The second above-mentioned object is achieved by a reflow soldering system used for carrying out a reflow soldering process at printed circuit boards provided with electronic components, comprising an article carrier with adjustable support elements for receiving thereon articles of different sizes, in particular for supporting printed circuit boards of different sizes during transport through a reflow soldering system, comprising a frame means, especially one frame member of said frame means being used as a support for an article to be carried, and at least one additional supporting element which is adapted to be adjusted relative to the frame member, wherein arresting means are provided with the aid of which the supporting element can be arrested relative to the frame member, said arresting means being adapted to be releasably arrested on a guide means along which the supporting element is displaceable, wherein said reflow soldering system comprises an adjustment device for adapting the adjustable supporting element of the article carrier to the size of the printed circuit boards to be accommodated.

The reflow soldering system according to the present invention provides a mechanical, automatic adaptation of the article carriers to the printed circuit board size to be processed at the time in question. Hence, the downtime of the system resulting from an intervention of an operator for adjusting the article carriers is minimized, and, simultaneously, the adaptation accuracy can be increased by means of a mechanical execution of the adjustment process.

According to an advantageous further development, the reflow soldering system according to the present invention is also provided with a vertical adjustment means for adjusting the level of the centre support of the article carrier. On the basis of the complete mechanical adaptability of the article carrier with regard to the dimensions of the printed circuit boards to be processed as well as with regard to the level of the centre support, the fast and reliable processing of printed circuit boards in the reflow soldering system is guaranteed. This results in an increase in the efficiency and in an improvement of the throughput through the system, and, in the final analysis, in advantages with regard to the operation and the maintenance of the system.

Further advantageous embodiments are characterized in the dependent claims.

In the following, the present invention will be explained and described in detail on the basis of an exemplary embodiment with reference to the drawings enclosed, in which.

Figure 1:
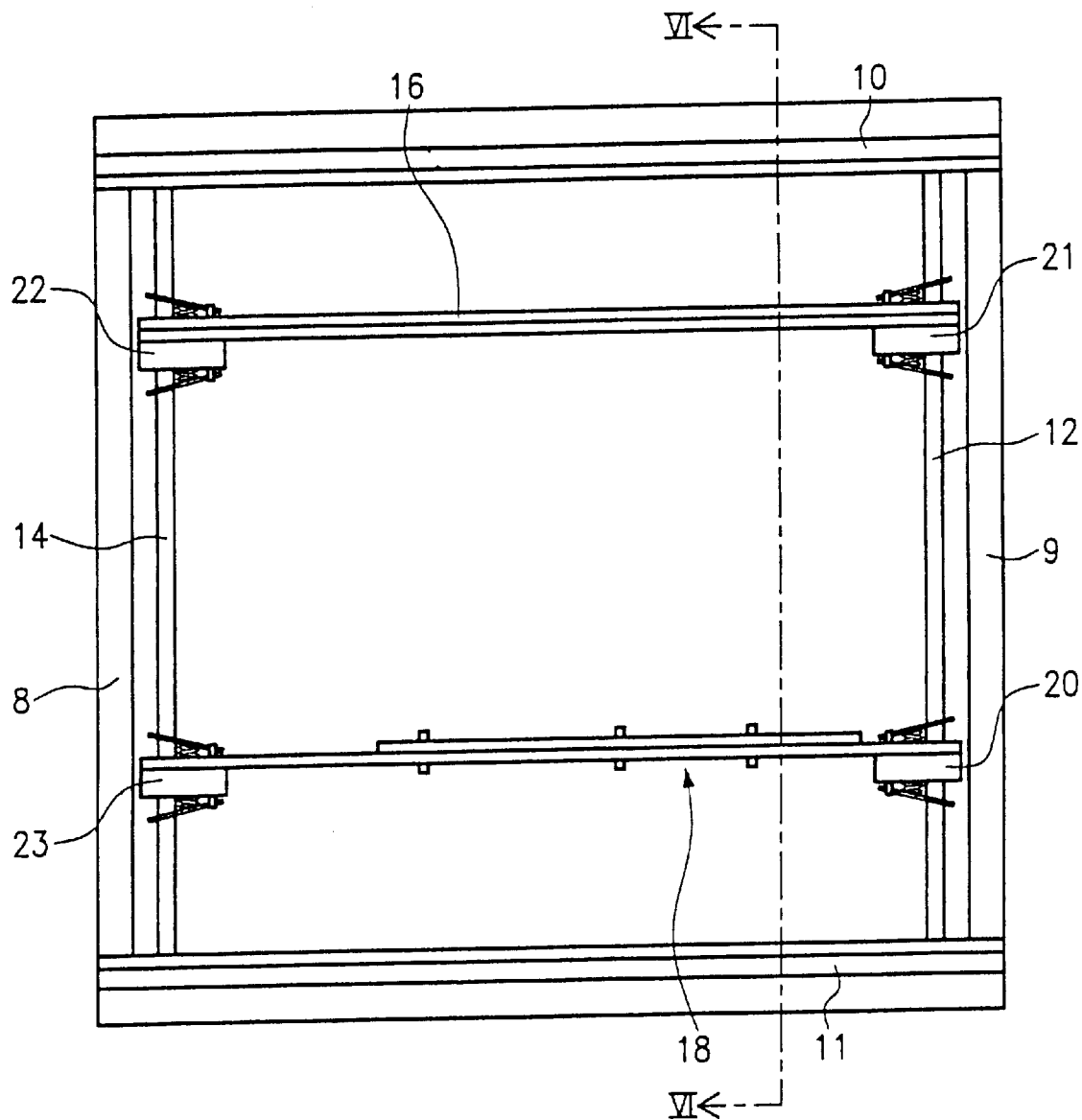
FIG. 1 shows a top view of an article carrier according to the present invention.

FIG. 1 shows a top view of an article carrier according to the present invention. The article carrier comprises an outer frame means consisting of four frame members 8, 9, 10 and 11 which are joined such that they essentially define a rectangle. Between the two parallel frame members 10 and 11, two rails 12 and 14 are attached in the vicinity of the lateral frame members 8 and 9, said rails 12, 14 extending substantially at right angles to said frame members 10 and 11. Said rails have attached thereto a supporting element 16 via respective arresting elements 21 and 22 and a vertically adjustable centre support 18 via respective arresting elements 20 and 23. By means of the arresting elements 20, 21, 22 and 23 provided on the rails 12 and 14, the centre support 18 and the supporting element 16 are attached such that they can releasably be locked in position; hence, they can be displaced along the rails when the locking engagement has been released.

Figure 2:
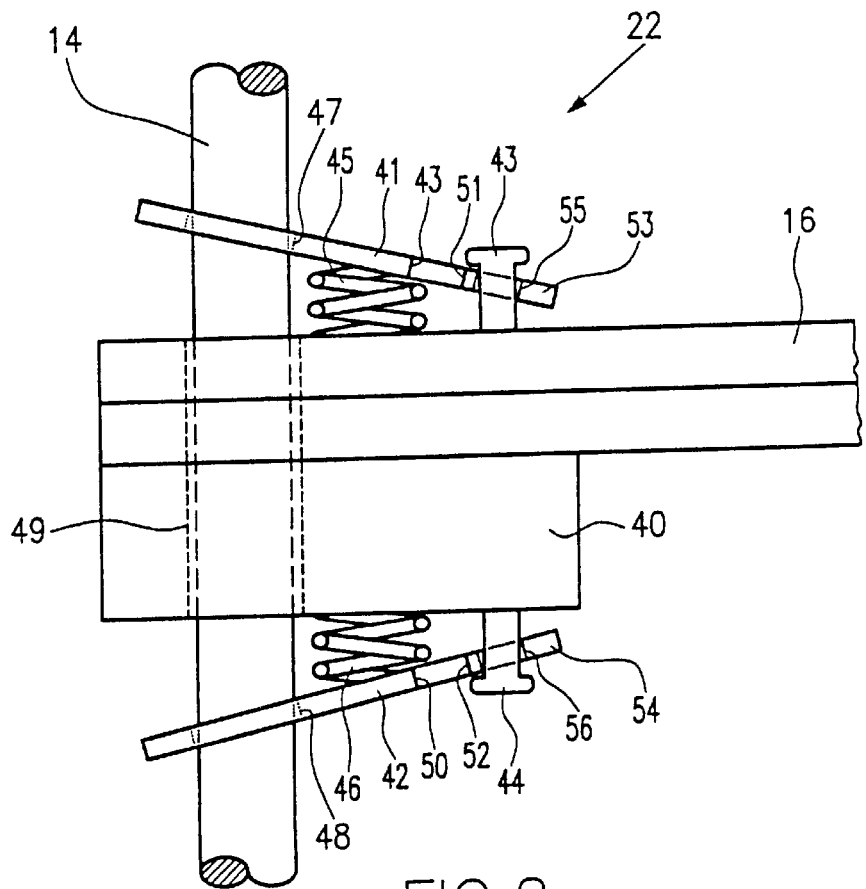
FIG. 2 shows a top view of an arresting means according to the present invention in detail.

FIG. 2 shows a top view of the arresting element 22 in an enlarged representation. The supporting element 16 has a body 40 secured thereto, said body 40 being provided with an opening 49 through which the substantially rod-shaped rail 14 extends. The body 40 has attached thereto clamping plates 41 and 42 at both sides thereof, each of said clamping plates 41, 42 being articulated on the body 40 at its end facing away from the rail 14. The articulated connection with the body 40 comprises bollards 43 and 44 projecting on either side of the body 40. The clamping plates 41 and 42 have openings 55 and 56 in the area of the articulated connection, said openings encompassing the bollards 43 and 44 between the expanded ends and the body. Said openings 55 and 56 are dimensioned such that an amount of play is provided, which suffices to move the clamping plates 41 and 42 through a large angular area without breaking the articulated connection. In addition, respective springs 45 and 46 are provided between the body 40 and the clamping plates 41 and 42, said springs 45, 46 resting on the body 40 on the one hand and on a central area of the respective clamping plate on the other. By means of the springs 45 and 46, the clamping plates 41 and 42 are spring-loaded towards a position which is deflected relative to the parallel abutting position on the body 40. In addition, the clamping plates 41 and 42 have a respective opening 47, 48 in the area of the rail 14, said opening 47, 48 being implemented such that it is essentially complementary to the cross-sectional shape of the rail 14 and slightly larger than said rail 14. The sizes of said openings 47 and 48 in connection with the opening 49 and the cross-sectional shape and the size of the rail 14 are adapted to one another in such a way that, due to the fact that the clamping plates 41 and 42 are spring-loaded relative to the body 40 by means of the springs 45 and 46, the respective clamping plates are brought into contact with the rail in the area of their openings, which has the effect that the rail is either clamped in position in the respective opening 47, 48 or that it is fixed by clamping contact with the inner wall of the opening 49.

For unlocking, the clamping plates 41 and 42 are moved, in a direction opposite to the spring-biased direction, to a position where they extend essentially at right angles to the length of the rail 14, i.e. they are pressed onto the lateral surfaces of the body 40. Unlocking can be effected mechanically, i.e. by machine, in an advantageous manner by means of an adjustment device in the form of a gripper having the shape of a pair of tongs. When the clamping plates 41 and 42 are pressed together, i.e. unlocked, by means of such a tong gripper, the supporting element 16 can be displaced along the rail 14 by displacing the tong gripper together with the arresting element 22.

Figure 3:
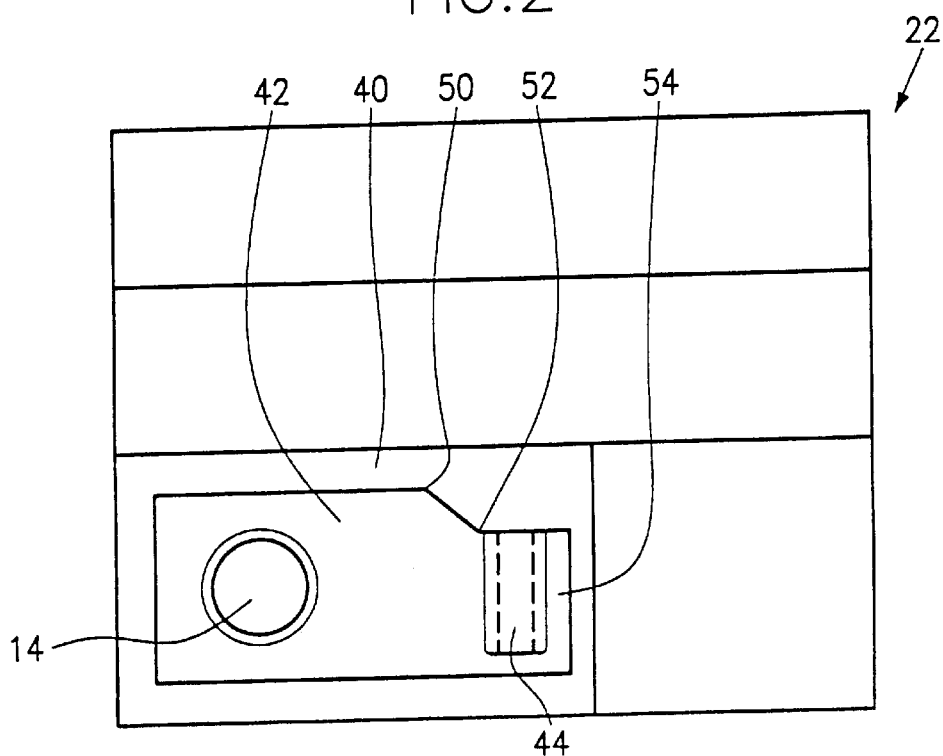
FIG. 3 shows a side view of the arresting means shown in FIG. 2.

FIG. 3 shows a side view of the arresting element 22 shown in FIG. 2. The side view of the arresting element 22 clearly shows the structural design of the clamping plate 42, especially the way in which the articulated connection with the body 40 is formed. The clamping plate 42 tapers in the direction of the articulated connection at the upper lateral edge thereof, the width of said clamping plate decreasing in the area between two break points 50 amd 52 of the lateral line. In an end portion 54 of the clamping plate, a U-shaped opening is provided, which is engaged by a bollard 44 whose shape is complementary to that of the U-shaped opening, said bollard 44 having an elongate cross-section and being fixedly connected to the body 40.

Neither the shape of the clamping plate 42 nor the implementation of the articulated connection are limited to the embodiment described in the present connection. The point of articulation can also be at the other end of the clamping plate and, if desired, the plate end projecting beyond the rail 14 can be can be extended. The plate can have any desired shape, said shape being not limited to the form which tapers towards the point of articulation and which is precisely shown in the present connection. Whereas the articulated connection shown in the present context is particularly simple and easy to manufacture, it would also be imaginable to use a hinged joint or other kinds of connections.

Quite generally, the clamping effect can be achieved not only by means of an arresting element of the kind shown in FIGS. 2 and 3 but also with the aid of e.g. a rail with expansion means. The rail, in turn, is not limited to the rod shape shown in the present connection, but it may have any kind of profile, e.g. a T-section.

Figure 4:
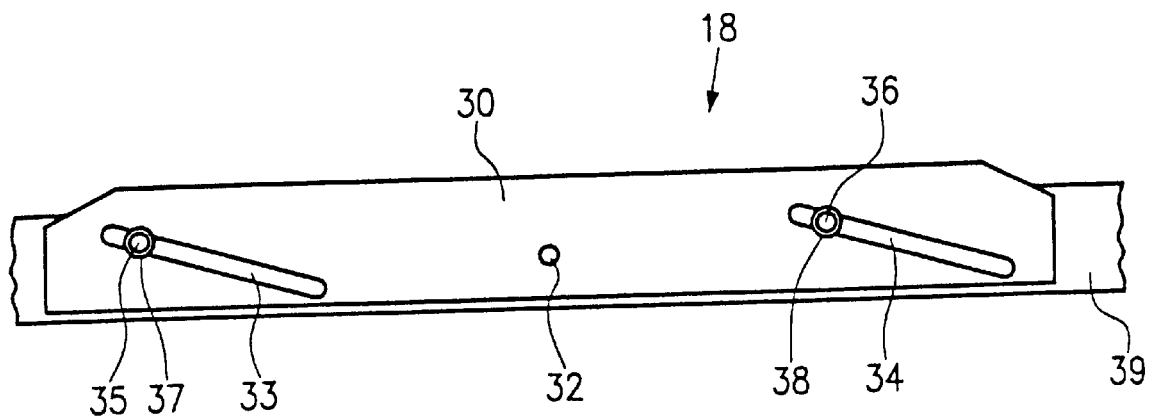
FIG. 4 shows a side view of a vertically adjustable centre support according to the present invention.

FIG. 4 shows a side view of a central area of the vertically adjustable centre support 18. A support 39, both ends of which are connected to a respective arresting element shown in FIGS. 2 and 3, has attached thereto a displaceable plate 30 for vertical adjustment. The displaceable plate 30 is provided with two slot-shaped elongate guide means 33 and 34, which are parallel to one another and which are arranged on the,same level in laterally displaced relationship with one another, said slot-shaped guide means 33, 34 forming an angle of more than 0° and less than 180° relative to the direction of the support 39. Two studs 35 and 36, which are fastened to the support 39 on the same level, project through these slot-shaped guide means. The ends of the studs, which either have screws fastened thereto or are expanded in some other way, support respective cup springs 37 and 38 by means of which the displaceable plate 30 is spring-loaded and pressed against the support 39. The displaceable plate 30 has attached thereto a laterally projecting pin 32, which serves as an actuating element or handle.

Due to the fact that the displaceable plate 30 is spring-loaded by the cup springs 37 and 38, the position of said displaceable plate 30 is stable due to the friction which is active between the two elements. The displaceable plate 30 can only be displaced relative to the support 39 if a force exceeding a certain threshold is applied, precise guidance being provided by the slot-shaped guide means 33 and 34. When a force directed parallel to the support 39 is applied, the displaceable plate 30 is displaced relative to the support 39 not only with regard to its lateral but also with regard to its vertical position due to the inclination of the slot-shaped guide means 34 and 35 relative to the longitudinal direction of the support 39.

The configuration for the vertical adjustment shown here only represents an embodiment which is preferred on the basis of its mechanically simple structural design. In particular, this kind of vertical adjustment is preferably suitable for an automatical mechanical adjustment, since a tong gripper provided on the reflow soldering system has to be brought into engagement with the pin 32 on the displaceable plate 30, whereupon it will suffice to displace said pin 32 in only one direction for causing also a vertical adjustment of the centre support. Since the inclination of the slot-shaped guide means 33 and 34 relative to the direction of the support port 39 is known, also a quantitatively precise determination of the vertical adjustment is possible by adjusting the distance of displacement of the gripper along the direction of the support 39.

Figure 5:
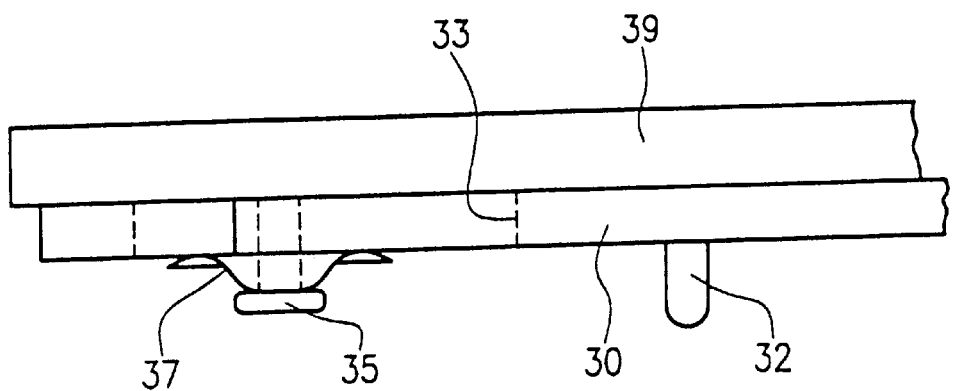
FIG. 5 shows a top view of the vertically adjustable centre support shown in FIG. 4.

In FIG. 5, the vertically adjustable centre support shown in a side view in FIG. 4 is shown again in a top view. Said FIG. 5 shows in a particularly clear manner how the cup spring rests, on the one hand, on the bollardlike-expanded end of the stud 35 projecting through the slot-shaped guide means 33 and, on the other hand, on the displaceable plate.

Figure 6:
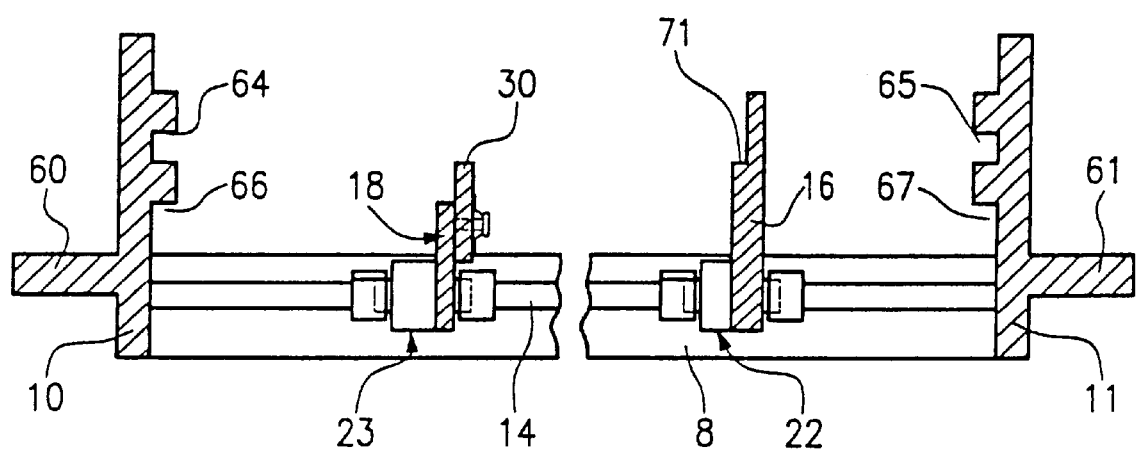
FIG. 6 shows a cross-sectional view of the article carrier according to the present invention along line VI—VI of FIG. 1.

FIG. 6 shows a cross-sectional view along line VI—VI in FIG. 1. According to the embodiment shown here, the frame members 10 and 11 each have a profile with inwardly projecting strips 64, 66 and 65, 67, respectively, on which the printed circuit boards can rest. The supporting element 16 is provided with a ledge 71 which extends on a level corresponding to that of the strip 64 and which also serves as a support for a printed circuit board to be carried. Between the left frame member 10 and the supporting element 16, the vertically adjustable centre support 18 is shown. The frame members are additionally provided with externally projecting flanges 60 and 61 on which the article carriers rest on a suitable transport frame which is fixedly connected to the transport system of the reflow soldering system.

It goes without saying that the exact shape of the profiles of the frame members can be adapted to the requirements of the goods or printed circuit boards to be transported and can then deviate from the shape which is shown in FIG. 6 by way of example.

The reflow soldering system according to the present invention, which is not designated in detail in the drawing, is provided with simple mechanical tong grippers, which are pivotable and linearly movable e.g. by sprindle drive means. The grippers of the reflow machine are, in particular, implemented as fixed U-shaped forks whose front distance width is dimensioned such that the arresting element fits in precisely over the width of the body 40 including the height of the projecting bollards 43 and 44. When the U-shaped forks are pivoted or displaced along the clamping plates 41 and 42 in the direction of the rails, the clamping plates are pressed onto the body 40 against the biasing force of the springs, whereby the clamping effect is eliminated and the locking engagement is released. When these forks have been moved to the position at which the locking engagement is released, the grippers can be displaced in a direction along the rails e.g. by means of spindle drives, whereby the position of the supporting element will be displaced relative to the frame member 11. By pivoting the fork-shaped grippers back or by drawing them back, the clamping effect is produced again and the arrestment is reestablished.

In a similar way, a fork-shaped gripper can engage the pin 32 of the vertically adjustable centre support and displace the vertically adjustable plate 30 by a linear displacement along the direction of the support 39, whereby said displaceable plate 30 will move in the lateral as well as in the vertical direction in view of the inclined slot-shaped guide means.

What is claimed is:

1. An article carrier for supporting printed circuit boards comprising:
    frame means including a pair of spaced and substantially parallel frame members for supporting the circuit board, the pair of spaced frame members being in direct contact for supporting the circuit board;
    at least one supporting element extending substantially parallel to said pair of frame members and positioned between said pair of frame members;
    guide means extending transversely between said pair of frame members and connected to said at least one supporting element, said at least one supporting element being selectively adjustable in its position between said pair of frame members along said guide means; and
    at least one arresting means mounted on said at least one supporting element enabling said at least one supporting element to be arrested at a desired location between said pair of frame members along said guide means.

2. An article carrier, according to claim 1, wherein:
    the arresting means comprises a clamping means which is suitable for stepless adjustment of the position of the supporting element.

3. An article carrier, according to claim 2, wherein:
    the arresting means includes a body and at least one clamping plate articulated on the body, the clamping plate being provided with an opening through which the guide means extends at least partially, and respective biasing means mounted on said arresting means enabling the clamping plate to be deflected until it abuts the opening of the clamping plate.

4. An article carrier, according to claim 1, wherein:
    the guide means comprises at least two rails which extend in the direction of adjustment of the supporting element and which are fixed to the frame means, the arresting elements being adapted to be arrested on said at least two rails.

5. An article carrier, according to claim 4, wherein:
    the biasing means is a spring interconnecting the clamping plate and the body.

6. An article carrier, according to claim 5, wherein:
    the center support is provided with vertically adjustable means, which is adapted to be adjusted in a vertical direction perpendicular to a plane defined by the pair of frame members and the supporting element.

7. An article carrier, according to claim 6, wherein:
    an actuating element is provided for vertical adjustment.

8. An article carrier, according to claim 1, wherein:
    an adjustable center support with further arresting means is provided between the pair of frame members and the supporting element.

9. An article carrier, according to claim 8, wherein:
    the vertically adjustable means comprises a displaceable plate attached to the support element and provided with a slot means along which said displaceable plate is adapted to be displaced in a direction including a vertical component.

10. An article carrier, according to claim 9, wherein:
    the slot means comprises two slot elements which are spaced in the longitudinal direction of the support element and which each form an angle relative to said longitudinal direction of the support element, the displaceable plate and the support cooperating via said slot elements so that, in response to a displacement of the displaceable plate in a direction along the support element, the displaceable plate will be forced to move in a vertical direction at right angles to the longitudinal dimension of the support element.

11. An article carrier, according to claim 10, wherein:
    the slot means is formed either in the displaceable plate or in the support element, and that the respective other member is provided with studs extending through said slot means.

12. An article carrier, according to claim 11, wherein:
    the studs are provided with biasing means pressing the displaceable plate against the support element.

13. An article carrier, according to claim 11, wherein:
    the biasing means are cup springs.

14. An article carrier, according to claim 1, wherein:
    the pair of frame members each includes at least one strip attached thereto so as to permit the articles to be supported on different levels.

15. An article carrier, according to claim 1, wherein:
    a control unit is provided for machine-controlled execution of the adjustment of the arresting means of the article carrier.

16. An article carrier with adjustable support elements for receiving thereon articles of different sizes, in particular for supporting printed circuit boards of different sizes during the transport through a reflow soldering system, comprising frame means, especially one frame member of said frame means being used as a support for an article to be carried, and at least one additional supporting element which is adapted to be adjusted relative to the frame member, wherein arresting means are provided with the aid of which the supporting element can be arrested relative to the frame member, said arresting means being adapted to be releasably arrested on a guide means along which the supporting element is displaceable, and an adjustable center support having further arresting means provided positioned between the frame member and the supporting element.

17. An article carrier, according to claim 16, wherein:
    the center support is provided with a vertically adjustable means, which is adapted to be adjusted in a vertical direction that is perpendicular to the plane defined by the support provided by the frame member and the supporting elements.

18. An article carrier, according to claim 17, wherein:
    the vertically adjustable means comprises a displaceable plate attached to the support element and provided with a slot means along which said displaceable plate is adapted to be displaced in a direction including a vertical component.

19. An article carrier, according to claim 18, wherein:
    the slot means comprises two slot elements which are spaced in the longitudinal direction of the support elements and which each form an angle relative to said longitudinal direction of the support element, the displaceable plate and the support element cooperating via said slot element so that, in response to a displacement of the displaceable plate in a direction along the support element, the displaceable plate will be forced to move in a vertical direction at right angles to the longitudinal dimension of the support element.

20. An article carrier, according to claim 18, wherein:
    the slot means are formed either in the displaceable plate or in the support element and that the respective other member is provided with studs extending through said slot means.

21. An article carrier, according to claim 16, wherein:
the studs are provided with biasing means pressing the displaceable plate against the support element.
22. An article carrier, according to claim 20, wherein:
the biasing means are cup springs.
23. An article carrier, according to claim 16, wherein:
an actuating element is provided for vertical adjustment of the center support.
24. An article carrier for supporting printed circuit boards comprising:
a frame for supporting the circuit board;
at least one supporting element positioned with said frame for direct support of the circuit board;
guide means extending transversely between said frame and connected to said at least one supporting element, said at least one supporting element being selectively adjustable in its position between said frame along said guide means; and
a pair of independently operable arresting means, each arresting means of said pair of arresting means being mounted at opposite ends of said at least one supporting element enabling said at least one supporting element to be arrested at a desired location between said frame along said guide means.

* * * * *

UNITED STATES PATENT AND TRADEMARK OFFICE
CERTIFICATE OF CORRECTION

PATENT NO. : 6,182,819 B1
DATED : February 6, 2001
INVENTOR(S) : Rehm

It is certified that error appears in the above-identified patent and that said Letters Patent is hereby corrected as shown below:

Claim 21,
Line 1, delete "16" and insert therefor -- 20 --;

Claim 22,
Line 1, delete "20" and insert therefor -- 21 --;

Claim 24,
Line 4, delete "with" and insert therefor -- within --.

Signed and Sealed this

First Day of January, 2002

Attest:

Attesting Officer

JAMES E. ROGAN
Director of the United States Patent and Trademark Office